United States Patent
Ireland et al.

(10) Patent No.: US 10,224,271 B2
(45) Date of Patent: *Mar. 5, 2019

(54) MODIFYING EXECUTION FLOW IN SAVE-TO-RETURN CODE SCENARIOS

(71) Applicant: International Business Machines Corporation, Armonk, NY (US)

(72) Inventors: Iain A. Ireland, North York (CA); Allan H. Kielstra, Ajax (CA); Muntasir A. Mallick, North York (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/838,548

(22) Filed: Dec. 12, 2017

(65) Prior Publication Data
US 2018/0101369 A1    Apr. 12, 2018

Related U.S. Application Data

(63) Continuation of application No. 15/064,014, filed on Mar. 8, 2016, now Pat. No. 9,921,816, which is a (Continued)

(51) Int. Cl.
*G06F 8/41*    (2018.01)
*G06F 9/30*    (2018.01)
(Continued)

(52) U.S. Cl.
CPC ........ *H01L 23/49838* (2013.01); *G06F 8/433* (2013.01); *G06F 8/443* (2013.01);
(Continued)

(58) Field of Classification Search
None
See application file for complete search history.

(56) References Cited

U.S. PATENT DOCUMENTS 6,289,446 B1 * 9/2001 Nilsson ............... G06F 9/4484
                                                712/244
6,662,354 B1 * 12/2003 Krablin ............... G06F 8/433
                                                717/140
(Continued)

FOREIGN PATENT DOCUMENTS

CA    2702354 A1    10/2010

OTHER PUBLICATIONS

Stack Overflow, "Failure of setjmp/longjmp", 2012, published at http://stackoverflow.com/questions/11139744/failure-of-setjmp-longjmp (Year: 2012).*

(Continued)

*Primary Examiner* — Hossain M Morshed
(74) *Attorney, Agent, or Firm* — Alexander G. Jochym

(57) ABSTRACT

A computer-implemented method includes, in a code transformation system, identifying save-to-return code instructions, function call code instructions, comparison code instructions, and exceptional code instructions. The function call code instructions are associated with the save-to-return code instructions. The comparison code instructions are associated with the save-to-return code instructions. The exceptional code instructions are associated with the comparison code instructions. A predefined proximity range based on a predefined proximity value as well as a proximity eligibility indicator are determined. The proximity eligibility indicator denotes whether the save-to-return code instructions and the comparison code instructions are within the predefined proximity range. Responsive to the proximity eligibility indicator denoting the save-to-return code instructions and the comparison code instructions are within the predefined proximity range, one or more execution flow relationships between the function call code instructions and the exceptional code instructions are created. A correspond- (Continued)

ing computer program product and computer system are also disclosed.

12 Claims, 7 Drawing Sheets

Related U.S. Application Data continuation of application No. 14/883,660, filed on Oct. 15, 2015, now Pat. No. 9,916,141.

(51) Int. Cl.
*H01L 21/48* (2006.01)
*H01L 23/00* (2006.01)
*H01L 23/498* (2006.01)

(52) U.S. Cl.
CPC .............. *G06F 9/30* (2013.01); *H01L 21/486* (2013.01); *H01L 21/4853* (2013.01); *H01L 21/4857* (2013.01); *H01L 23/49816* (2013.01); *H01L 23/49822* (2013.01); *H01L 23/49827* (2013.01); *H01L 23/49866* (2013.01); *H01L 23/49894* (2013.01); *H01L 24/81* (2013.01); *H01L 2224/81192* (2013.01)

(56) References Cited

U.S. PATENT DOCUMENTS

| | | | |
|---|---|---|---|
| 7,634,765 B2 | 12/2009 | Ghiya et al. | |
| 7,716,495 B2* | 5/2010 | Shupak | G06F 21/52 713/187 |
| 7,937,621 B2 | 5/2011 | Wang et al. | |
| 8,037,459 B2 | 10/2011 | Mavinakayanahalli et al. | |
| 8,640,113 B2 | 1/2014 | Silvera et al. | |
| 9,501,637 B2 | 11/2016 | LeMay et al. | |
| 9,916,141 B2 | 3/2018 | Ireland et al. | |
| 9,921,816 B2 | 3/2018 | Ireland et al. | |
| 2004/0243982 A1* | 12/2004 | Robison | G06F 8/443 717/132 |
| 2006/0047681 A1* | 3/2006 | Ghiya | G06F 8/433 |
| 2011/0289303 A1* | 11/2011 | Silvera | G06F 9/3004 712/228 |
| 2016/0147559 A1 | 5/2016 | Weimer | |
| 2017/0177367 A1 | 6/2017 | DeHon | |

OTHER PUBLICATIONS

Ireland et al., "Modifying Execution Flow in Save-to-Return Code Scenarios", U.S. Appl. No. 14/883,660, filed Oct. 15, 2015, 39 pages.

"Failure of setjmp/longjmp", Stack Overflow, Stack Exchange, asked Jun. 21, 2012, 2 pages, printed on Aug. 14, 2015, <http://stackoverflow.com/questions/11139744/failure-of-setjmp-longjmp>.

IBM, "List of IBM Patents or Patent Applications Treated as Related", Appendix P, 2 pages, filed herewith.

Ireland et al., "Modifying Execution Flow in Save-to-Return Code Scenarios", U.S. Appl. No. 15/064,014, filed Mar. 8, 2016, 28 pages.

Ireland et al., "Modifying Execution Flow in Save-to-Return Code Scenarios", U.S. Appl. No. 15/885,920, filed Feb. 1, 2018, 28 pages.

\* cited by examiner

```
1.  void main() {
2.      jmp_buf Environment;
3.      int ReturnValue;
4.      ReturnValue = setjmp(Environment)
5.      if (ReturnValue == 0) {
6.          Function();
7.      } else {
8.          return();
9.      }
10. }

11. void Function() {
12.     longjmp(Environment, 1);
13. }
```

FIG. 4

MODIFYING EXECUTION FLOW IN SAVE-TO-RETURN CODE SCENARIOS

BACKGROUND

The present invention relates generally to the field of code transformation systems, and more particularly to modifying execution flow relationships estimated by those systems.

Code transformation systems (such as compilers, interpreters, and code optimizers) are widely used in facilitating computer execution. Code transformation systems often estimate execution flow relationships between code instructions to assist in their execution flow analysis. Developers of those systems continue to face challenges in efficiently estimating execution flow relationships between code instructions, such as save-to-return code instructions.

SUMMARY

A computer-implemented method includes, in a code transformation system, identifying one or more save-to-return code instructions and identifying one or more function call code instructions. The one or more function call code instructions are associated with the one or more save-to-return code instruction. The computer-implemented method further includes identifying one or more comparison code instructions. The comparison code instructions are associated with the one or more save-to-return code instructions. The computer-implemented method further includes identifying one or more exceptional code instructions. The exceptional code instructions are associated with the one or more comparison code instructions. The computer-implemented method further includes determining a predefined proximity range based on a predefined proximity value and determining a proximity eligibility indicator. The proximity eligibility indicator denotes whether the one or more save-to-return code instructions and the one or more comparison code instructions are within the predefined proximity range. The computer-implemented method further includes, responsive to the proximity eligibility indicator denoting the one or more save-to-return code instructions and the one or more comparison code instructions are within the predefined proximity range, creating one or more execution flow relationships between the one or more function call code instructions and the one or more exceptional code instructions. A corresponding computer program product and computer system are also disclosed.

BRIEF DESCRIPTION OF THE DRAWINGS

FIG. 4 is an operational example of a save-to-return code scenario, in accordance with at least one embodiment of the present invention.

DETAILED DESCRIPTION

At least in some embodiments, the present invention modifies the code execution flow relationships produced by a code transformation system with respect to one or more code instructions comprising one or more save-to-return code instructions. A code transformation system may be a compiler, an interpreter, a code optimizer, any combination of the mentioned software platforms, or any other software platform that analyzes and/or estimates the execution flow of one or more code instructions. While some of the examples discussed in this document explain the present invention in computer system environments comprising a compiler, a person of ordinary skill in the art readily appreciates that the present invention may be implemented in a computer system environment comprising any code transformation system, as defined above (including any software platform that analyzes and/or estimates the execution flow of one or more code instructions).

A save-to-return code instruction may be any code instruction that, in whole or in part, saves some or all of the running environment of a point in the execution flow of one or more code instructions. In at least some embodiments, the running environment may in the future be used by one or more "jump-to-return" code instructions to restore code execution to a point after the execution of the save-to-return code instruction. While some of the examples discussed in this document explain the present invention with respect to set jmp and longjmp code instructions implemented in standard implementations of the C programming language, a person of ordinary skill in the art readily appreciates that the present invention may be implemented with respect to other save-to-return and/or jump-to-return code instructions, such as save-to-return and/or jump-to-return code instructions available in programming languages other than C.

Figure 1:
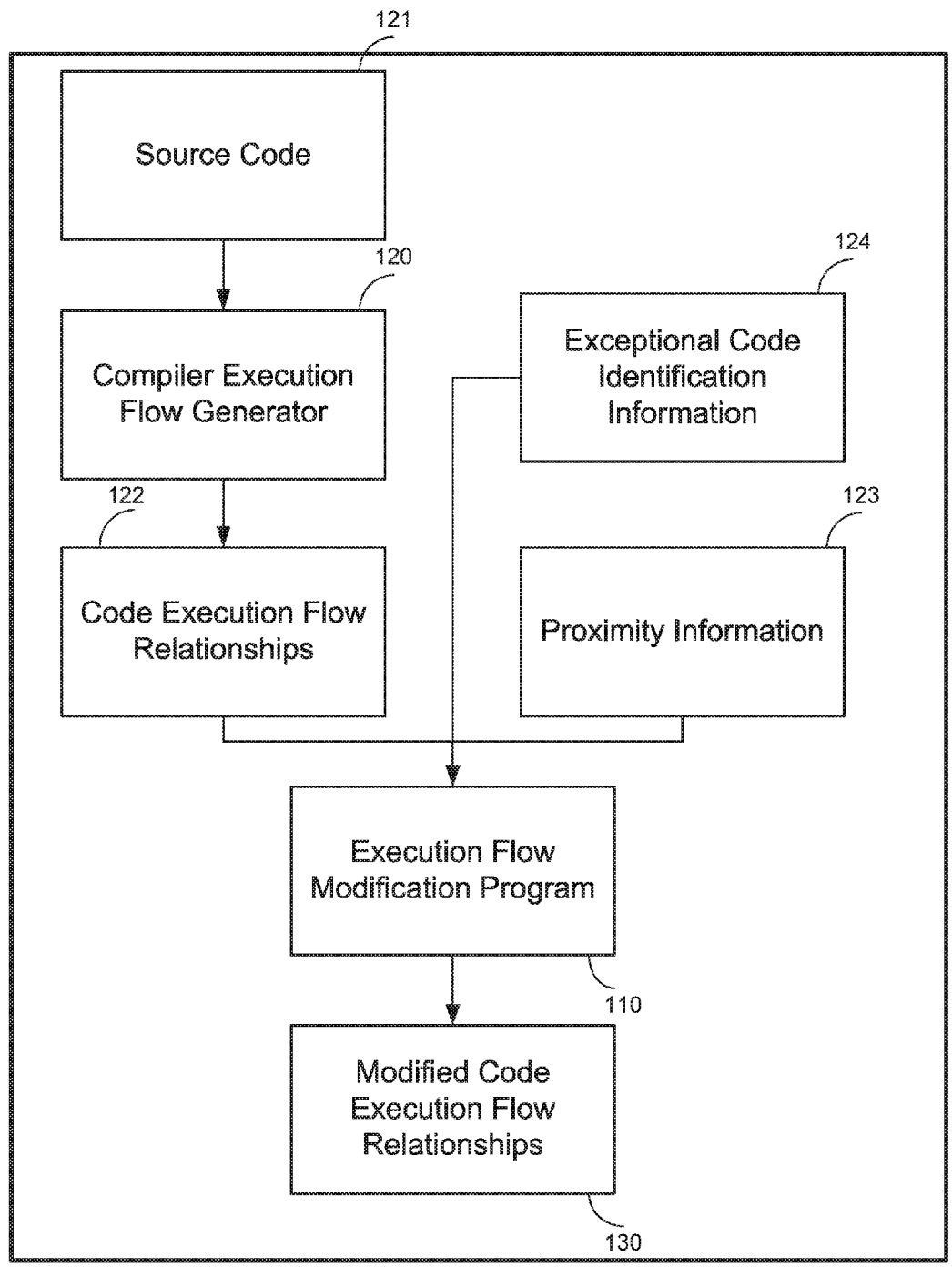
FIG. 1 is a block diagram of one embodiment of a computer system environment suitable for operation of an execution flow modification program, in accordance with at least one embodiment of the present invention.

FIG. 1 is a block diagram of one embodiment of a computer system environment suitable for operation of an execution flow modification program, in accordance with at least one embodiment of the present invention. In the computer system depicted in FIG. 1, a compiler execution flow generator 120 uses the source code 121 to estimate and/or produce one or more code execution flow relationships 122 between one or more components of the source code 121. In some embodiments, the compiler creates one or more execution flow relationships between blocks of source code, where a block comprises one or more code instructions that will, in successful executions of the source code, always be executed together (i.e. code instructions A and B are in the same block if, during a successful execution of the code, every time A executes, B also executes, and vice versa).

The computer system depicted in FIG. 1 also comprises one or more pieces of proximity information 123 and one or more pieces of exceptional code identification information 124. The execution flow modification program 110 uses the proximity information 123 to determine whether it should modify the code execution flow relationships 122. The program uses the exceptional code identification information 124 to determine which code instructions may be classified as "exceptional code instructions" as further discussed below. The program produces one or more modified execution flow relationships 130.

Figure 2:
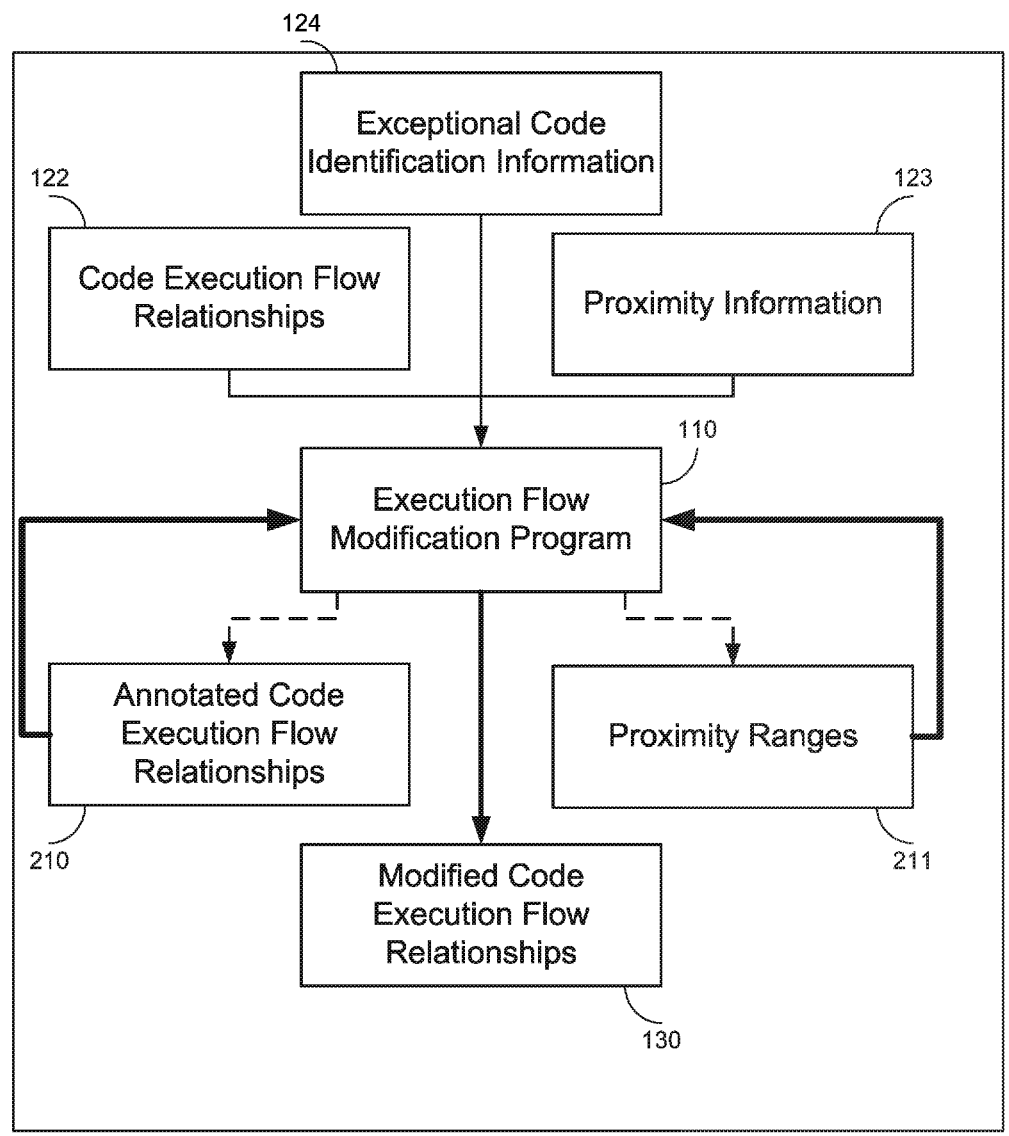
FIG. 2 is a data-flow diagram of an execution flow modification program, in accordance with at least one embodiment of the present invention.

FIG. 2 is a data flow diagram of an execution flow modification program, in accordance with at least one embodiment of the present invention. In the embodiment depicted in FIG. 2, the execution flow modification program 110 analyzes the code execution flow relationships 122 to locate the portions of the code execution flow relationships 122 associated with the execution flow of one or more save-to-return code instructions. The program produces one or more "annotated code execution flow relationships" 210 that comprise one or more code execution flow relationships associated with the execution flow of one or more save-to-return code instructions. In some embodiments, the annotated code execution flow relationships 210 may comprise the code execution flow relationships 122 with one or more indications locating those code execution flow relationships associated with the execution flow of one or more save-to-return code instructions.

In some embodiments, the code instructions associated with the execution flow of one or more save-to-return code instructions may comprise one or more save-to-return code instructions, one or more jump-to-return code instructions, one or more function calls associated with the save-to-return code instruction, one or more comparison code instructions, and/or one or more exceptional code instructions. In some embodiments, the code instructions associated with the execution flow of one or more save-to-return code instructions may comprise the one or more non-exceptional blocks of code associated with one or more comparison code instructions.

In at least some embodiments, save-to-return code instructions and/or a jump-to-return code instructions may be associated with one or more values, such as one or more values returned by the save-to-return code instruction and/or one or more values supplied as arguments to one or more jump-to-return code instructions. In some embodiments, a programmer may use one or more of the values associated with save-to-return code instructions and/or a jump-to-return code instructions to direct the code execution flow after an execution of a save-to-return code instruction and/or after an execution of a jump-to-return code instruction associated with the save-to-return code instruction. In some embodiments, the aforementioned task of directing code execution flow using values associated with one or more save-to-return code instructions and/or one or more jump-to-return code instructions may be accomplished using a conditional statement hereby referred to as a "comparison code instruction." In an exemplary embodiment, the comparison code instruction comprises a conditional statement in the C programming language (such as an if statement or a switch statement) that uses the value returned by the set jmp code instructions and/or the value supplied as an argument to the longjmp code instructions as its conditional variable.

In at least some embodiments, the comparison code instruction is associated with one or more blocks of code instruction that will conditionally be executed based on the one or more values associated with save-to-return and/or a jump-to-return code instructions (i.e. the "conditional variables" associated with the comparison code instruction). The execution flow modification program 110 identifies some of those one or more blocks of code instruction as "exceptional code instructions." In the embodiment depicted in FIG. 2, the program 110 identifies the exceptional code instructions based on one or more pieces of exceptional code identification information 124. In an exemplary embodiment, the program 110 identifies one or more blocks of code associated with a comparison code instruction as exceptional code instructions if the regular execution of those blocks of code is associated with the conditional variable associated with the comparison code instruction being non-zero. In some embodiments, the one or more pieces of the exceptional code identification information 124 are supplied by one or more users of the program 110.

In the embodiment depicted in FIG. 2, the execution flow modification program 110 uses proximity information 123 to determine one or more proximity ranges 211. In at least some embodiments, the program 110 only modifies the code execution flow relationships 122 associated with the source code 121 if a save-to-return instruction and its associated comparison code instruction are within a pre-defined proximity range 211. A proximity range 211 may be defined based on a proximity value. The proximity value between two code instructions A and B, when A dominates B (i.e. when every path of execution flow to B from the point of start of execution comprises executing A), is the number of code instructions (e.g. in the context of high level programming languages, source code instructions; in the context of intermediate-level programming languages, intermediate language instructions; in the context of assembly language, assembly language instructions; in the context of machine language, machine language instructions) dominated by A and post-dominated by B (where X is post-dominated by B if every path of execution flow from X to the point of end of execution flow comprises executing B). In some embodiments, the program 110 determines a proximity range 211 based on proximity information 123 other than the proximity value, such as proximity information 123 obtained and/or derived from the code execution flow relationships 122 and/or the annotated code execution flow relationships 210.

In the embodiment depicted in FIG. 2, the execution flow modification program 110 uses the proximity ranges 211 to determine which of the one or more code execution flow relationships 122 need to be modified. The program modifies the code execution relationships 122 and produces the one or more modified execution flow relationships 130.

Figure 3:
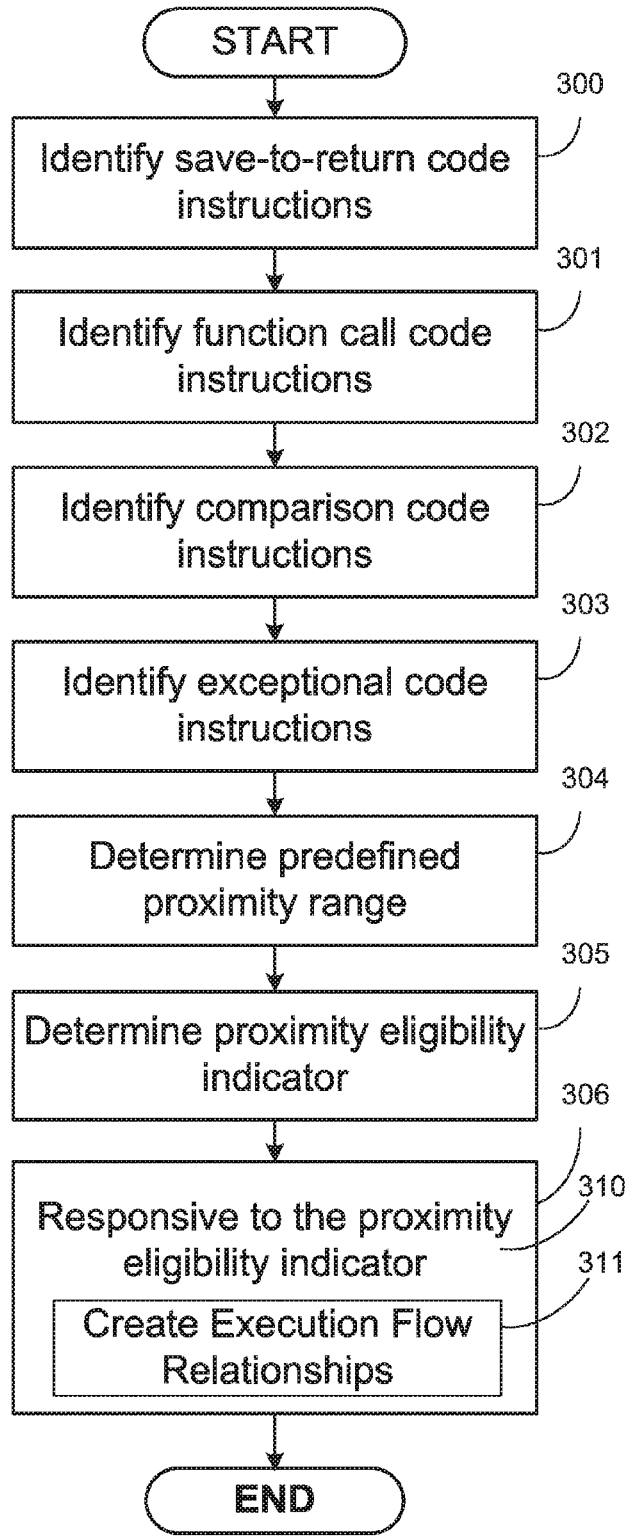
FIG. 3 is a flow-chart diagram of an execution flow modification program, in accordance with at least one embodiment of the present invention.

FIG. 3 is a flowchart diagram of an execution flow modification program, in accordance with at least one embodiment of the present invention. At step 300, the program identifies one or more save-to-return code instructions. At step 301, the program identifies one or more function call code instructions associated with the one or more save-to-return code instructions. At step 302, the program identifies one or more comparison code instructions associated with the one or more save-to-return code instructions. At step 303, the program identifies one or more exceptional code instructions associated with the one or more comparison code instructions. At step 304, the program determines a predefined proximity range based on a predefined proximity value. At step 305, the program determines a proximity eligibility indicator denoting whether the one or more save-to-return code instructions and the one or more comparison code instructions are within the predefined proximity range. At step 306, responsive to the proximity eligibility indicator denoting that the one or more save-to-return code instructions and the one or more comparison code instructions are within the predefined proximity range 310, the program creates one or more execution relationships between the one or more function call code instructions and the one or more exceptional code instructions 311.

FIG. 4 is an operational example of a sequence of code instructions comprising a save-to-return code instruction and a jump-to-return code instruction, in accordance with at least one embodiment of the present invention. In the source code sequence 400, written in accordance with the syntax of a standard implementation of the C programming language, line 1 comprises a declaration of the main( ) function, which is the entry point of execution in standard implementations of the C programming language. Line 2 comprises declaring a variable Environment of the type jump_buf (i.e. capable of storing at least part of an execution environment). Line 3 comprises declaring a variable ReturnValue of the type int (i.e. capable of storing an integer value). Line 4 comprises initializing the Environment variable with the execution environment present during an execution of that line, using the set jmp save-to-return code instruction. Line 4 also comprises code instructions storing the value returned by the set jmp code instruction in the ReturnValue variable.

In the operational example depicted in FIG. 4, the set jmp code instruction returns the value of zero in non-exceptional executions (i.e. executions of the non-exceptional code instructions associated with a comparison code instruction), and returns a non-zero value in exceptional executions (i.e. executions of the exceptional code instructions associated with a comparison code instruction). Line 5 comprises a comparison code instruction in the form of an "if" statement. The comparison code instruction notes that if the value of the ReturnValue variable is zero (i.e., denoting a non-exceptional execution), then a call of the function Function( ) would occur in line 6. If the value of the ReturnValue variable is non-zero, the exceptional code instructions marked by the else keyword on line 7 and enclosed by curly braces on lines 7 and 8 will be executed. In the operational example depicted in FIG. 4, the exceptional code instructions comprise a call to a return( ) function, which here terminates execution of the code instructions.

In the operational example depicted in FIG. 4, a non-exceptional execution of the source code sequence 400 assigns a value of zero to the ReturnValue variable on line 4. Therefore, a call to Function( ) would occur on line 6, leading to the execution of lines 11-13 of the source code sequence 400. In line 11, the source code sequence 400 comprises a declaration of Function( ). In Line 12, the source code sequence 400 comprises the longjmp jump-to-return code instruction. In the operational example depicted in FIG. 4, the first parameter of longjmp code instructions denotes the execution environment that the longjmp code instruction restores, and the second parameter of the longjmp code instruction (if any) denotes the value assigned to the variable that is also target of an assignment by the execution of the setjmp code instruction associated with the execution environment being restored (i.e. the value assigned to the ReturnValue variable).

In the operational example depicted in FIG. 4, the longjmp code instruction in line 12 assigns the value 1, a non-zero value, to the ReturnValue variable. Therefore, upon restoration of the execution environment to the environment present immediately after the execution point when the Environment variable was last assigned a value (i.e., line 5, immediately after line 4 that includes the set jmp statement which initialized the Environment variable), the execution flow transitions to the exceptional code instructions, here the return( ) function call code instruction on line 8. In the operational example depicted in FIG. 4, if the second parameter of the longjmp code instruction in line 12 was zero, or if the longjmp code instruction in line 12 had no second parameter, the execution flow may have entered a loop and may never have executed the one or more exceptional code instructions. In fact, during successful executions, the execution flow may only reach one or more exceptional code instructions through a longjmp code instruction in the one or more non-exceptional code blocks that changes the value of the ReturnValue variable, and not through the initial execution of the comparison code instruction following the execution of the set jmp code instruction.

Figure 5:
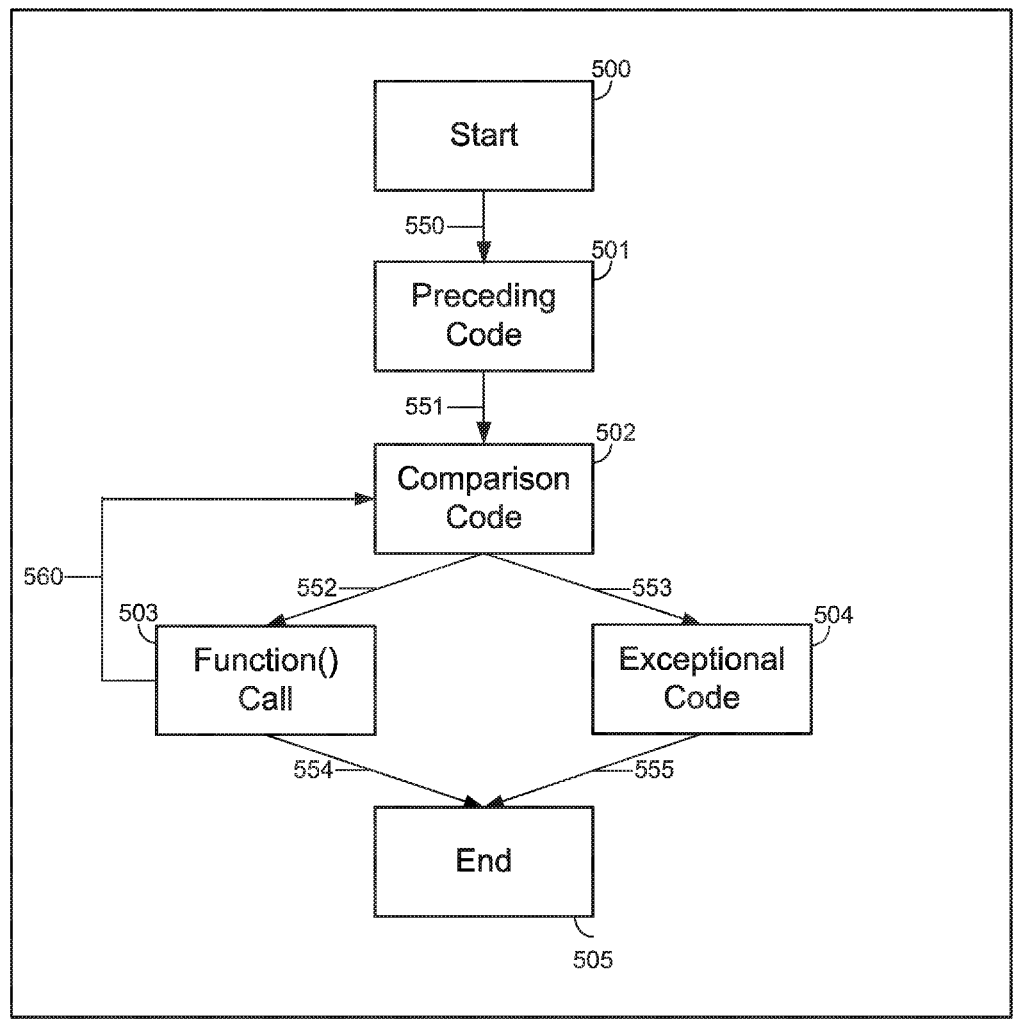
FIG. 5 is an operational example of code execution flow relationships produced by a code transformation system, in accordance with at least one embodiment of the present invention.

FIG. 5 is an operational example of code execution flow relationships produced by a code transformation system for lines 1-10 of the code sequence 400. In the operational example depicted in FIG. 5, execution flow relationship 550 moves the execution flow from the point of start of execution 500 to the code instructions preceding the comparison code instruction 501 (i.e. code instructions in lines 1-4, including the initialization of the ReturnValue variable by the return value of the set jmp code instruction in line 4). Importantly, the preceding code 501 instructions comprise a save-to-return code instruction (i.e. the set jmp code instruction on line 4 of code sequence 400 in FIG. 4). Execution flow relationship 551 moves the execution flow from the code instructions preceding the comparison code instruction 501 to the comparison code instruction 502 starting at line 5. Execution flow relationship 552 moves the execution flow from the comparison code instruction 502 to the call of the Function( ) 503 at line 6. In the operational example depicted in FIG. 5, execution flow relationship 552 will only be executed if the value of the ReturnValue variable is zero. The code execution flow relationship 553 moves the execution flow from the comparison code 502 to the exceptional code 504 at line 8, if the value of ReturnValue variable is nonzero. Execution flow relationship 554 move the execution flow from the call of Function( ) 503 to the point of the end of the execution 505. Execution flow relationship 555 moves the execution flow from the exceptional code 504 to the point of the end of the execution 505.

In constructing the code execution flow relationships depicted in the operational example of FIG. 5, a compiler may assume that some or all of function call code instructions in the non-exceptional code instructions associated with a comparison code instruction (such as the call of the Function( ) 503 in line 6) may include one or more jump-to-return code instructions, such as one or more longjmp code instruction. To address this possibility, the compiler will create one or more code execution flow relationships between some or all of function call code instructions and one or more save-to-return code instructions (and/or one or more comparison code instructions). Such code execution flow relationships may move in a reverse direction relative to the general direction of the program execution from the point of the entry of execution 500 to the point of the end of the execution 505. In the operational example depicted in FIG. 5, the code execution flow relationship 560 is an example of such a "reverse code execution flow relationship." The creation of such reverse code execution flow relationships (and the cycle they create in the overall code execution flow representation of a sequence of code instructions) may complicate the code execution flow analysis performed by the compiler using the overall code execution flow representation. This, in turn, may lead to higher compilation time and less effective optimization of code execution.

In at least some embodiments, a jump-to-return code instruction (such as the code instruction on line 12) will not itself be represented in the one or more execution flow relationships and will instead be assumed to be performed by one or more function call code instructions (such as the function call on line 6).

Figure 6:
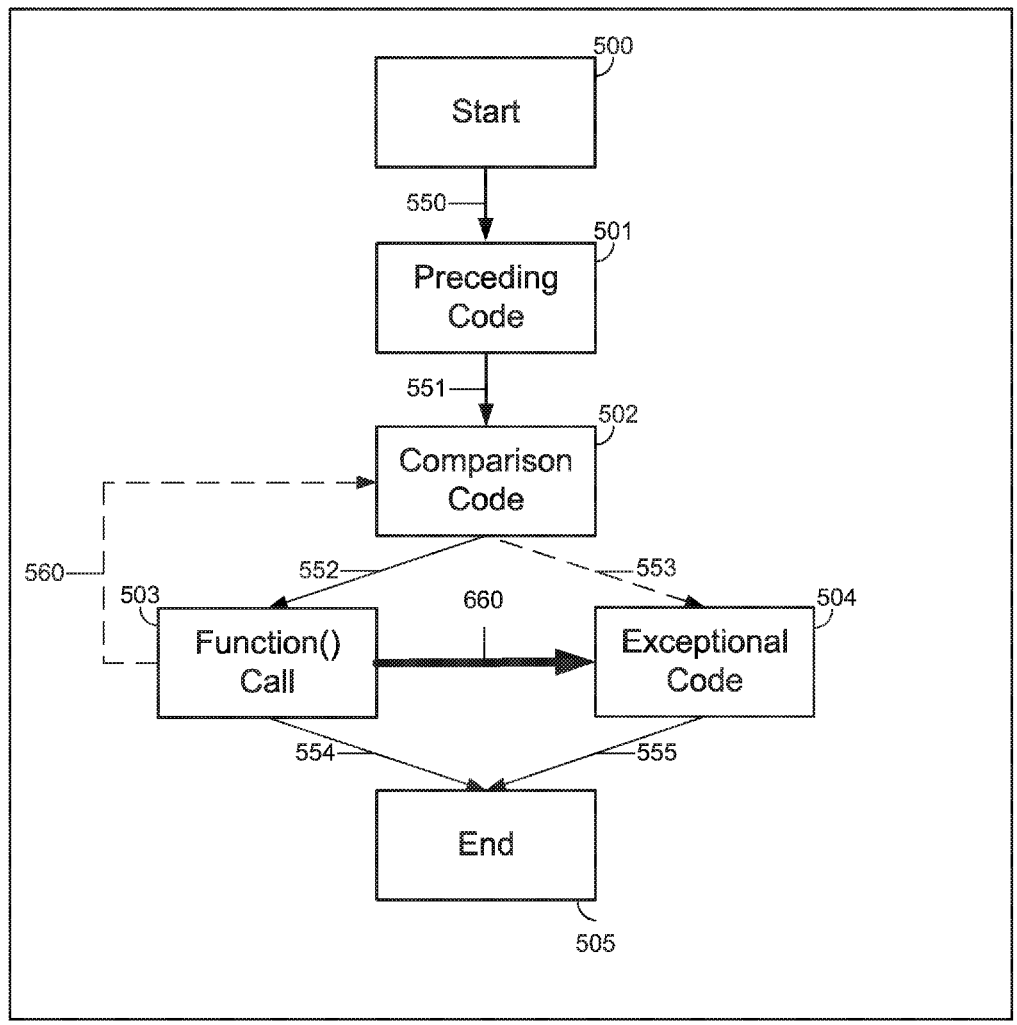
FIG. 6 is an operational example of modified code execution flow relationships produced by an execution flow modification program, in accordance with at least one embodiment of the present invention.

FIG. 6 is an operational example of modified code execution flow relationships produced by an execution flow modification program. In the operational example depicted in FIG. 6, the program has removed the reverse code execution flow relationship 560 (marked by dotted lines, indicating removal of a code execution flow relationship). In addition, the program has also removed the code execution flow relationship 553 between the comparison code instructions 502 and the exceptional code instructions 504. The program has created a new execution flow relationship 660 between the Function( ) call 503 and the exceptional code instructions 504 (marked by a bold line, indicating creation of an execution flow relationship). This improved overall code execution flow representation of the code instructions avoids the potential complications and inefficiencies brought about by the presence of reverse execution flow relationships in the execution flow picture of the one or more code instructions.

In some embodiments, the execution flow modification program identifies one or more save-to-return code instructions, one or more function call code instructions, one or more comparison code instructions, and one or more exceptional code instructions based on the identifying information directly or indirectly provided by a code transformation system and/or by the rules of a programming language and/or coding platform. The program uses those identifications to determine a predefined proximity range and a proximity eligibility indicator, and to create one or more execution flow relationships between the one or more save-to-return code instructions and the one or more function call code instructions responsive to the proximity eligibility indicator.

In other embodiments, the execution flow modification program identifies the code instructions of the various types mentioned above based on the behavior of one or more code instructions and/or the code execution flow relationships corresponding to one or more code instructions. In an exemplary embodiment, the program analyzes the code execution flow relationships of a sequence of one or more source code instructions and determines that a statement saving the execution environment of the program is a save-to-return code instruction. The program uses those behavior-based identifications to determine a predefined proximity range and a proximity eligibility indicator, and to create one or more execution flow relationships between the one or more save-to-return code instructions and the one or more function call code instructions responsive to the proximity eligibility indicator. In some embodiments, the execution flow modification program will determine that some code instructions that do not exhibit all of the properties of a save-to-return code instruction (e.g. one or more "jump" code instructions) may nevertheless be identified as a save-to-return code instruction if their code execution flow behavior at least in part corresponds to that of one or more save-to-return code instructions.

The execution flow modification program identifies one or more save-to-return code instructions at step 300. A save-to-return code instruction may be any code instruction that, in whole or in part, saves some or all of the running environment of a point in the execution flow of one or more code instructions. In at least some embodiments, the running environment may in the future be used by one or more jump-to-return code instructions to restore code execution to a point at or immediately after the execution of the save-to-return code instruction, along with restoring some or all of the execution environment to the environment present during or immediately after the initial execution of the save-to-return code instruction. In at least some embodiments, save-to-return code instructions and/or a jump-to-return code instructions may be associated with one or more values, such as one or more values returned by the save-to-return code instruction and/or one or more values supplied as arguments to one or more jump-to-return code instructions. In some embodiments, a programmer may use one or more of the values associated with save-to-return code instructions and/or a jump-to-return code instructions to direct the code execution flow after the execution of a save-to-return code instruction. In some embodiments, the one or more save-to-return code instructions comprise one or more set jmp code instructions. In some embodiments, the one or more jump-to-return code instructions comprise one or more longjmp code instructions.

The execution flow modification program identifies one or more function call code instructions associated with the one or more save-to-return code instructions at step 301. A function call code instruction may be any code instruction that, in whole or in part, causes the execution of one or more code instructions grouped together and/or defined in some way as part of the same functional unit of code execution by the programmer and/or rules of one or more programming languages and/or one or more coding platforms. A function call code instruction may be the call of a procedure, method, function, subroutine, any combination of those constructs, or any other sequence of one or more code instructions grouped together and/or packaged as a unit of execution. Examples of a function call code instruction include a call of a procedure in COBOL, a call of a method in Java®, and a call of a function in C. A function call code instruction may comprise any call of or reference to an anonymous function, such as a lambda function. In some embodiments, one or more function call code instructions are associated with one or more save-to-return code instruction if the one or more function call code instructions are potentially reachable by the execution flow path after an execution of the one or more save-to-return code instructions. In some embodiments, one or more function call code instructions are associated with one or more save to return code instruction if the function call code instructions are dominated by the execution flow path after an execution of one or more save-to-return code instructions. In some embodiments, each of one or more function calls in one or more code instruction collections and/or one or more code instruction files are considered to be associated with each of the one or more save-to-return code instructions in the one or more code instruction collections and/or one or more code instruction files.

The execution flow modification program identifies one or more comparison code instructions associated with the one or more save-to-return code instruction at step 302. A comparison code instruction may be any code instruction that, in whole or in part, causes the conditional execution of one or more blocks of code based on one or more values associated with one or more save-to-return code instructions and/or one or more values associated with one or more jump-to-return code instructions. The comparison performed by a comparison code instruction may be Boolean (e.g. binary), numeric (e.g. integer and/or floating point), or any other mode of comparison using any other high-level, intermediate-level, low-level, or machine code construct accomplishing the task of conditional execution of and/or conditional control flow transfer to one or more blocks of code. It should be noted that the term block as used in this document refers to one or more code instructions that will, in successful executions of the source code, always be executed together. As such, the notion is extensible to any programming languages and/or coding platforms that do not explicitly support concepts associated with marking and/or handling blocks of code.

The execution flow modification program identifies one or more exceptional code instructions associated with the comparison code instructions at step 303. In some embodiments, the program identifies other code instructions, such as one or more jump-to-return instructions. In identifying one or more code instructions of various types (e.g. one or save-to-return code instructions, one or more jump-to-return code instructions, one or more comparison code instructions, one or more exceptional code instructions, one or more non-exceptional code blocks associated with one or more comparison code instructions, and/or one or more function call code instructions, etc.), the program may use any information produced by one or more software platforms (including code execution flow relationships and/or annotated code execution flow relationships produced by a code transformation system).

In some embodiments, to identify code instructions of various types in source code and/or among one or more execution flow relationships estimated based on the source code, the execution flow modification program may use one or more of any information produced by one or more software platforms, historic execution data generated and/or stored by the program or other one or more software platforms, rules of programming languages and/or coding platforms, hardware platform properties, hardware instruction set architecture, and any other information that directly or indirectly provide information about identifying code instructions of various types in source code and/or among one or more execution flow relationships estimated based on source code. Existing compilation and code transformation technologies available in the art enable a person of ordinary skill in the art to identify code instructions of various types in source code and/or among one or more execution flow relationships estimated based on source code.

The execution flow modification program determines a predefined proximity range based on a predefined proximity value at step 304. In some embodiments, the program solely considers the predefined proximity value in determining a predefined proximity range. In an exemplary embodiment, given a predefined proximity value of 2, the program determines the predefined proximity range to be the area between a save-to-return code instruction and the second code instruction being dominated by the save-to-return code instruction (including the save-to-return code instruction and the second code instruction).

In some embodiments, the execution flow modification program considers factors in addition to the proximity value, such as the number, type, and/or function of the code instructions dominated by one or more save-to-return code instructions and post-dominated by the one or more comparison code instructions associated with the one or more save-to-return code instruction in determining a pre-defined proximity range. In some embodiments, the program ignores code instructions other than function call code instructions in determining the predefined proximity range based on a proximity value. In an exemplary embodiment, given a predefined proximity value of 2, the program determines the predefined proximity range to be the area between the save-to-return code instruction and the second function call code instruction associated with the save-to-return code instruction (including the save-to-return code instruction and the second function call code instruction). In at least some of those embodiments, the program may have a predefined proximity range that spans to the point of the end of the program execution if the number of function calls (or other specified, qualifying code instructions) associated with the initial execution of the save-to-return code instruction is less than the predefined proximity value.

In some embodiments, the predefined proximity value is zero. In at least some of those embodiments, the execution flow modification program determines a proximity eligibility indicator denoting that one or more save-to-return code instructions and one or more comparison code instruction are within a pre-defined proximity range if the one or more save-to-return code instructions are immediate neighbors of the one or more comparison code instructions (e.g. if no code instruction is dominated by the one or more save-to-return code instructions and post-dominated by the one or more comparison code instructions). In at least some of those embodiments, the modified execution flow relationships produced by the execution flow modification program are guaranteed to estimate the execution flow of a sequence of one or more code instructions comprising one or more save-to-return code instructions in a way that addresses the possibility of the presence of jump-to-return code instructions in all function calls associated with each of the one or more set-to-return code instructions. In some embodiments, the execution flow modification program determines a proximity eligibility indicator denoting that one or more save-to-return code instructions and one or more comparison code instruction are within a pre-defined proximity range if the one or more save-to-return code instructions are in the same block of code as the one or more comparison code instructions.

In some embodiments, the execution flow modification program identifies one or more intervening code instructions that are dominated by the one or more save-to-return code instructions and post-dominated by the one or more comparison code instructions. In those embodiments, the pre-defined proximity indicator is determined without considering the one or more intervening code instructions and the one or more exceptional code instructions comprise the one or more intervening code instructions. In at least some of those embodiments, the program ignores any code instructions dominated by the one or more save-to-return code instructions and post-dominated by the one or more comparison code instructions in calculating a predefined proximity range, which leads to a proximity eligibility indicator denoting that the one or more save-to-return code instructions and the one or more comparison code instructions are within a predefined proximity range if the predefined proximity value is zero or positive. In at least some of those embodiments, the program considers the code instructions dominated by the one or more save-to-return code instructions and post-dominated by the one or more comparison code instructions to be part of the exceptional code instructions.

The execution flow modification program determines a proximity eligibility indicator at step 305. The proximity eligibility indicator denotes whether the one or more save-to-return code instructions and the one or more comparison code instructions are within the predefined proximity range. In some embodiments, determining a proximity eligibility indicator comprises identifying one or more post-save code instructions, where the one or more post-save code instructions comprise as many code instructions as the predefined proximity value and the one or more post-save code instructions are dominated by the one or more save-to-return code instructions. In at least some of those embodiments, determining a proximity eligibility indicator further comprises determining whether the one or more post-save code instructions comprise the one or more comparison code instructions. In at least some of those embodiments, the program counts the number of code instructions dominated by an initial execution of a save-to-return code instruction. If the count reaches the value equal to the predefined proximity value and the program has not found a comparison code instruction associated with the save-to-return code instruction since the start of its counting, the program determines a proximity eligibility indicator denoting that the save-to-return instruction and the comparison code instruction are not within the predefined proximity range. In some of those embodiments, the program may ignore some or all types of code instructions in its counting. In some of those embodiments, the program may always determine a proximity eligibility indicator denoting that one or more save-to-return code instructions and one or more comparison code instructions are within a predefined proximity range.

In some embodiments, determining a proximity eligibility indicator comprises identifying one or more intervening code instructions being dominated by the one or more save-to-return code instructions and being postdominated by the one or more comparison code instructions, determining an intervening code instruction length indicating how many code instructions the one or more intervening code instructions comprise, and comparing the intervening instruction length and the predefined proximity value. In at least some of those embodiments, the execution flow modification program locates a comparison code instruction being dominated by a save-to-return code instruction. The program counts the number of the intervening code instructions being dominated by the save-to-return code instruction and postdominated by the comparison code instruction. If the count value is greater than the predefined proximity value, the program determines a proximity eligibility indicator denoting that the save-to-return instruction and the comparison code instruction are not within the predefined proximity range; if the count value is not greater than the predefined proximity value, the program determines a proximity eligibility indicator denoting that the save-to-return instruction and the comparison code instruction are within the predefined proximity range. In at least some of those embodiments, the program locates the one or more comparison code instructions.

In general, different embodiments of the present invention may use different methods of determining a proximity eligibility indicator, depending on one or more of the information, the guidelines, and/or the criteria used to determine the predefined proximity range, the capabilities of the hardware platform and the programming language and/or coding platform used, and the implementation choices specific to the needs, desires, and/or the resources at hand. In some embodiments, the execution flow modification program identifies the starting point and the ending point of the predefined proximity range, where the starting point of the predefined proximity range is a point in the code execution flow of one or more code instructions that dominates all the code instructions in the predefined proximity range and the ending point of the predefined proximity range is a point in the code execution flow that post-dominates all the code instructions in the predefined proximity range. The program determines if one or more save-to-return code instructions and one or more comparison-code instructions dominated by the one or more save-to-return code instructions are within the area between the starting and the ending point (excluding the starting point and the ending point). In some embodiments, the program will always determine a proximity eligibility indicator denoting that one or more save-to-return code instructions and one or more comparison code instructions are within a predefined proximity range.

Responsive to the proximity eligibility indicator denoting the one or more save-to-return code instructions and the one or more comparison code instructions are within the predefined proximity range 310, the execution flow modification program creates one or more execution flow relationships between the one or more function call code instructions and the one or more exceptional code instructions 311 at step 306. In some embodiments, the program removes the reverse execution flow relationships between the one or more function call code instructions and the one or more save-to-return code instructions. In some embodiments, the program removes the execution flow relationships between the one or more save-to-return code instructions and the one or more exceptional code instructions. In some embodiments, the one or more save-to-return code instructions dominate the one or more comparison code instructions, and the one or more comparison code instructions postdominate the one or more save-to-return code instructions. In some embodiments, the program removes one or more reverse execution flow relationships between the one or more function call code instructions and one or more code instructions selected from the group consisting of: (i) the one or more save-to-return code instructions and (ii) the one or more comparison code instructions.

A code instruction may comprise one or more instructions to any one or more computer hardware components and/or any one or more computer software components, including one or more instructions in a high-level programming language (including a high-level language integrated with one or more application programming interfaces), intermediate programming language, assembly language, machine language, microcode, millicode, etc. Code instructions comprising one or more save-to-return and/or one or more jump-to-return code instructions may enable complex control flow modification, including of the kind used for exception handling in many programming languages and/or coding platforms.

Removing reverse execution flow relationships from the overall code execution flow representation of one or more code instructions comprising one or more save-to-return code instructions may reduce code transformation time, such as compilation time, by simplifying the overall code execution flow representation of the code instructions. In addition, creating code execution flow relationships between one or more function call code instructions and one or more exceptional code instructions to replace the reverse execution flow relationships between one or more function call code instructions and one or more save-to-return code instructions may remove the need for execution of the one or more save-to-return code instructions following execution of one or more jump-to-return code instructions, and thus may reduce execution time. Nevertheless, the aforementioned advantages are not required to be present in all of the embodiments of the invention and may not be present in all of the embodiments of the invention.

Figure 7:
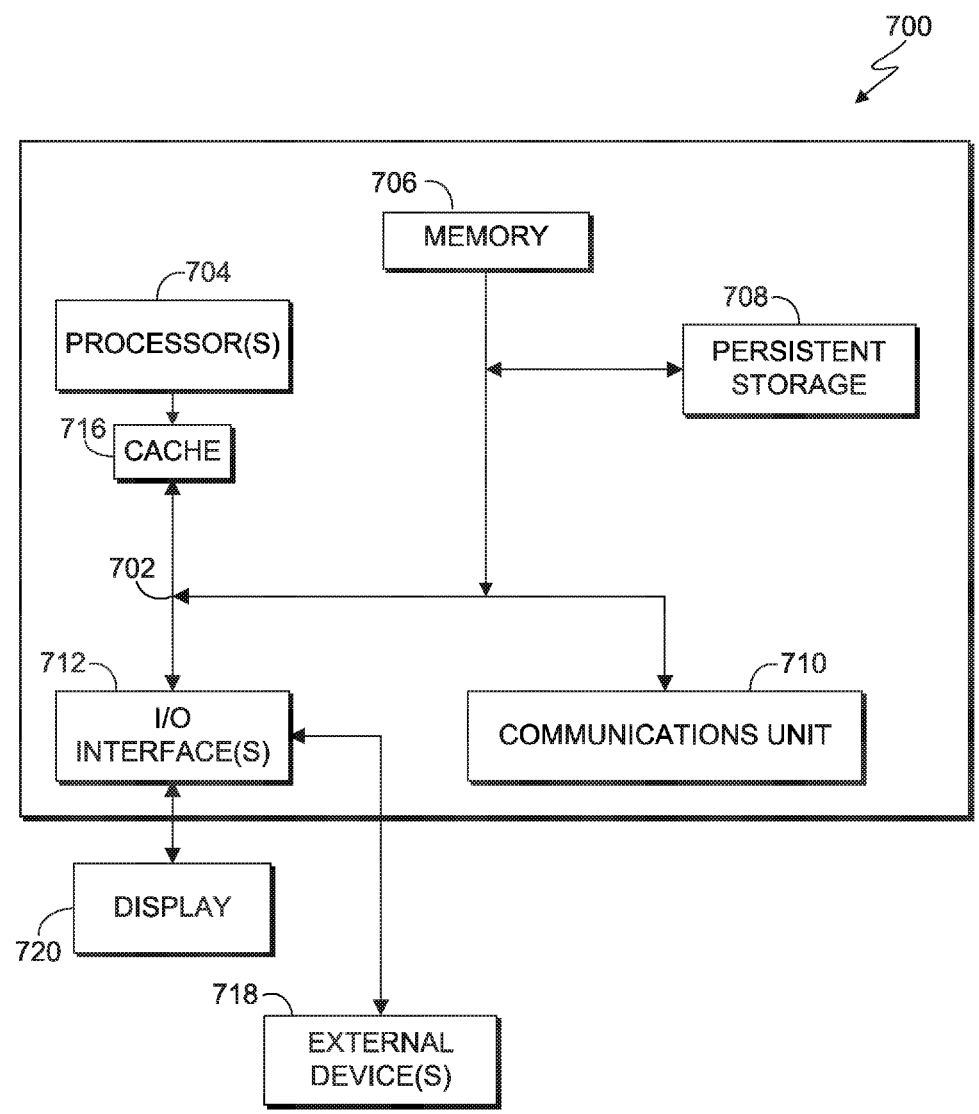
FIG. 7 is a block diagram of a computing apparatus suitable for executing an execution flow modification program, in accordance with at least one embodiment of the present invention.

FIG. 7 is a block diagram depicting components of a computer 700 suitable for executing the execution flow modification program. FIG. 7 displays the computer 700, the one or more processor(s) 704 (including one or more computer processors), the communications fabric 702, the memory 706, the RAM, the cache 716, the persistent storage 708, the communications unit 710, the I/O interfaces 712, the display 720, and the external devices 718. It should be appreciated that FIG. 7 provides only an illustration of one embodiment and does not imply any limitations with regard to the environments in which different embodiments may be implemented. Many modifications to the depicted environment may be made.

As depicted, the computer 700 operates over a communications fabric 702, which provides communications between the cache 716, the computer processor(s) 704, the memory 706, the persistent storage 708, the communications unit 710, and the input/output (I/O) interface(s) 712. The communications fabric 702 may be implemented with any architecture suitable for passing data and/or control information between the processors 704 (e.g. microprocessors, communications processors, and network processors, etc.), the memory 706, the external devices 718, and any other hardware components within a system. For example, the communications fabric 702 may be implemented with one or more buses or a crossbar switch.

The memory 706 and persistent storage 708 are computer readable storage media. In the depicted embodiment, the memory 706 includes a random access memory (RAM). In general, the memory 706 may include any suitable volatile or non-volatile implementations of one or more computer readable storage media. The cache 716 is a fast memory that enhances the performance of computer processor(s) 704 by holding recently accessed data, and data near accessed data, from memory 706.

Program instructions for the execution flow modification program may be stored in the persistent storage 708 or in memory 706, or more generally, any computer readable storage media, for execution by one or more of the respective computer processors 704 via the cache 716. The persistent storage 708 may include a magnetic hard disk drive. Alternatively, or in addition to a magnetic hard disk drive, the persistent storage 708 may include, a solid state hard disk drive, a semiconductor storage device, read-only memory (ROM), electronically erasable programmable read-only memory (EEPROM), flash memory, or any other computer readable storage media that is capable of storing program instructions or digital information.

The media used by the persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of the persistent storage 708.

The communications unit 710, in these examples, provides for communications with other data processing systems or devices. In these examples, the communications unit 710 may include one or more network interface cards. The communications unit 710 may provide communications through the use of either or both physical and wireless communications links. The execution flow modification program may be downloaded to the persistent storage 708 through the communications unit 710. In the context of some embodiments of the present invention, the source of the various input data may be physically remote to the computer 700 such that the input data may be received and the output similarly transmitted via the communications unit 710.

The I/O interface(s) 712 allows for input and output of data with other devices that may operate in conjunction with the computer 700. For example, the I/O interface 712 may provide a connection to the external devices 718, which may include a keyboard, keypad, a touch screen, and/or some other suitable input devices. External devices 718 may also include portable computer readable storage media, for example, thumb drives, portable optical or magnetic disks, and memory cards. Software and data used to practice embodiments of the present invention may be stored on such portable computer readable storage media and may be loaded onto the persistent storage 708 via the I/O interface(s) 712. The I/O interface(s) 712 may similarly connect to a display 720. The display 720 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product, comprising:
   one or more computer readable storage media and program instructions stored on said one or more computer readable storage media, said program instructions comprising instructions to, in a code transformation system:
   identify one or more save-to-return code instructions;
   identify one or more function call code instructions, said one or more function call code instructions being associated with said one or more save-to-return code instructions;
   identify one or more comparison code instructions, said one or more comparison code instructions being associated with said one or more save-to-return code instructions; identify one or more exceptional code instructions, said one or more exceptional code instructions being associated with said one or more comparison code instructions;
   determine a predefined proximity range based on a predefined proximity value, said predefined proximity value is a number of code instructions between the one or more comparison code instructions and the save-to-return code instructions;
   determine a proximity eligibility indicator, said proximity eligibility indicator denoting whether said one or more save-to-return code instructions and said one or more comparison code instructions are within said predefined proximity range;
   in response to the proximity eligibility indicator denoting said one or more save-to-return code instructions and said one or more comparison code instructions are within said predefined proximity range, modify one or more execution flow to remove one or more reverse execution flow relationships between said one or more function call code instructions and one or more code instructions selected from a group consisting of said one or more save-to-return instructions and said one or more comparison code instructions; and
   in response to the modification of said one or more execution flow, reduce code transformation time.

2. The computer program product of claim 1, wherein said predefined proximity value is zero.

3. The computer program product of claim 1, wherein code instructions associated with said one or more save-to-return code instructions comprise one or more setjmp code instructions.

4. The computer program product of claim 1, wherein instructions to determine said proximity eligibility indicator comprise instructions to:
   identify one or more post-save code instructions, said one or more post-save code instructions comprising as many code instructions as said predefined proximity value and being dominated by said one or more save-to-return code instructions; and determine whether said one or more post-save code instructions comprise said one or more comparison code instructions.

5. The computer program product of claim 1, wherein instructions to determine said proximity eligibility indicator comprise instructions to:
identify one or more intervening code instructions, said one or more intervening code instructions being dominated by said one or more save-to-return code instructions and postdominated by said one or more comparison code instructions;
determine an intervening code instruction length, said intervening code instruction length indicating how many code instructions said one or more intervening code instructions comprise; and
compare said intervening code instruction length and said predefined proximity value.

6. The computer program product of claim 1, wherein:
said one or more save-to-return code instructions dominate said one or more comparison code instructions; and
said one or more comparison code instructions postdominate said one or more save-to-return code instructions.

7. A computer system comprising:
a processor;
one or more computer readable storage media;
computer program instructions;
said computer program instructions being stored on said one or more computer readable storage media; and
said computer program instructions comprising instructions to: identify one or more save-to-return code instructions;
identify one or more function call code instructions, said one or more function call code instructions being associated with said one or more save-to-return code instructions;
identify one or more comparison code instructions, said one or more comparison code instructions being associated with said one or more save-to-return code instructions; identify one or more exceptional code instructions, said one or more exceptional code instructions being associated with said one or more comparison code instructions;
determine a predefined proximity range based on a predefined proximity value, said predefined proximity value is a number of code instructions between the one or more comparison code instructions and the save-to-return code instructions;
determine a proximity eligibility indicator, said proximity eligibility indicator denoting whether said one or more save-to-return code instructions and said one or more comparison code instructions are within said predefined proximity range;
in response to the proximity eligibility indicator denoting said one or more save-to-return code instructions and said one or more comparison code instructions are within said predefined proximity range, modify one or more execution flow to remove one or more reverse execution flow relationships between said one or more function call code instructions and one or more code instructions selected from a group consisting of said one or more save-to-return instructions and said one or more comparison code instructions; and
in response to the modification of said one or more execution flow, reduce code transformation time.

8. The computer system of claim 7, wherein said predefined proximity value is zero.

9. The computer system of claim 7, wherein code instructions associated with said one or more save-to-return code instructions comprise one or more setjmp code instructions.

10. The computer system of claim 7, wherein instructions to determine said proximity eligibility indicator comprise instructions to:
identify one or more post-save code instructions, said one or more post-save code instructions comprising as many code instructions as said predefined proximity value and being dominated by said one or more save-to-return code instructions; and determine whether said one or more post-save code instructions comprise said one or more comparison code instructions.

11. The computer system of claim 7, wherein instructions to determine said proximity eligibility indicator comprise instructions to:
identify one or more intervening code instructions, said one or more intervening code instructions being dominated by said one or more save-to-return code instructions and postdominated by said one or more comparison code instructions;
determine an intervening code instruction length, said intervening code instruction length indicating how many code instructions said one or more intervening code instructions comprise; and
compare said intervening instruction length and said predefined proximity value.

12. The computer program system of claim 7, wherein:
said one or more save-to-return code instructions dominate said one or more comparison code instructions; and
said one or more comparison code instructions postdominate said one or more save-to-return code instructions.

* * * * *